(12) United States Patent
Jung et al.

(10) Patent No.: US 9,275,847 B2
(45) Date of Patent: Mar. 1, 2016

(54) RECYCLING UNIT AND SUBSTRATE TREATING APPARATUS

(71) Applicant: Semes Co., Ltd., Cheonan-si, Chungcheongnam-do (KR)

(72) Inventors: In-Il Jung, Cheonan-si (KR); Eun-Sun Jung, Cheonan-si (KR); Chan-Young Heo, Cheonan-si (KR); Jeong Seon Park, Cheonan-si (KR); Seong-Soo Kim, Cheonan-si (KR)

(73) Assignee: Semes Co., Ltd., Chungcheongnam-do (KR)

(*) Notice: Subject to any disclaimer, the term of this patent is extended or adjusted under 35 U.S.C. 154(b) by 154 days.

(21) Appl. No.: 14/228,731

(22) Filed: Mar. 28, 2014

(65) Prior Publication Data

US 2014/0290093 A1    Oct. 2, 2014

(30) Foreign Application Priority Data

Mar. 29, 2013  (KR) .................. 10-2013-0034546
Jul. 19, 2013  (KR) .................. 10-2013-0085552

(51) Int. Cl.
*F26B 21/06*    (2006.01)
*H01L 21/00*    (2006.01)

(52) U.S. Cl.
CPC ........................... *H01L 21/00* (2013.01)

(58) Field of Classification Search
CPC .............. F26B 3/00; F26B 5/00; F26B 9/00; F26B 21/00; F26B 21/06; B01D 3/00; B01D 3/26; B01D 53/22; C01B 31/20; A01N 25/00; A01N 59/04
USPC ........... 34/570, 77.78, 79, 201, 218; 202/153, 202/161; 424/405, 84, 717
See application file for complete search history.

(56) References Cited

U.S. PATENT DOCUMENTS

| | | | | |
|---|---|---|---|---|
| 3,757,427 A | * | 9/1973 | Wilkinson | ............... B05D 3/04 34/479 |
| 5,940,985 A | * | 8/1999 | Kamikawa | ........ H01L 21/02052 257/E21.228 |
| 7,437,834 B2 | * | 10/2008 | Nakatsukasa | ..... H01L 21/02052 34/381 |
| 8,196,312 B2 | * | 6/2012 | Taguchi | ................ B41C 1/1083 118/65 |

(Continued)

FOREIGN PATENT DOCUMENTS

KR    2007-0012560 A    1/2007
KR    101155612 B1    6/2012

(Continued)

*Primary Examiner* — Stephen M Gravini
(74) *Attorney, Agent, or Firm* — Harness, Dickey & Pierce

(57) ABSTRACT

The substrate treating apparatus includes a drying chamber in which an organic solvent remaining on a substrate is dissolved by using a fluid, and a recycling unit including a separator for separating the organic solvent from the fluid discharged from the drying chamber to recycle the fluid. The separator includes a distiller in which a fluid containing an organic solvent having a first concentration is introduced, a heating unit heating a fluid containing an organic solvent having a second concentration discharged from the distiller, and supplying an evaporated fluid containing an organic solvent having a third concentration into the distiller, and a condensation unit liquefying a fluid containing an organic solvent having a fourth concentration discharged from the distiller. The organic solvent has the second concentration, the first concentration, the third concentration, and the fourth concentration which are successively lowered in concentration.

33 Claims, 15 Drawing Sheets

(56) References Cited

U.S. PATENT DOCUMENTS 8,904,668 B2 * 12/2014 Priebe .................. F26B 3/22
 101/450.1
2014/0290093 A1 * 10/2014 Jung .................. H01L 21/00
 34/570

FOREIGN PATENT DOCUMENTS

| KR | 20130007396 A |   | 1/2013 |
|----|---------------|---|--------|
| KR | 20130007397 A |   | 1/2013 |
| KR | 20130014311 A |   | 2/2013 |
| KR | 20140120238 A | * | 10/2014 |

* cited by examiner

RECYCLING UNIT AND SUBSTRATE TREATING APPARATUS

CROSS-REFERENCE TO RELATED APPLICATIONS

This U.S. non-provisional patent application claims priority under 35 U.S.C. §119 of Korean Patent Application Nos. 10-2013-0034546, filed on Mar. 29, 2013, and 10-2013-0085552, filed on Jul. 19, 2013, the entire contents of which are hereby incorporated by reference.

BACKGROUND OF THE INVENTION

The present invention disclosed herein relates to a substrate manufacturing apparatus, and more particularly, to a unit for recycling a supercritical fluid that is used in a supercritical drying process and a substrate treating apparatus including the same.

Semiconductor devices are manufactured through various processes such as a photolithography process for forming a circuit pattern on a substrate such as a silicon wafer. However, during the manufacturing process, various foreign substances such as particles, organic pollutants, metal impurities, and the like may be generated. Since the foreign substances cause substrate defects, this may have a direct effect on yield of the semiconductor devices. Thus, a cleaning process for removing the foreign substances may be essentially involved in the semiconductor manufacturing process.

In a general cleaning process, the foreign substances are removed from a substrate by using a cleansing agent, and then the substrate is cleaned by suing deionized water (DI-water). Thereafter, the substrate is dried by using isopropyl alcohol (IPA). However, since the drying process is reduced in drying efficiency when the semiconductor device has a fine circuit pattern, and a pattern collapse phenomenon in which the circuit pattern is damaged during the drying process frequently occurs, the driving process may be unsuitable for a semiconductor device having a line width of about 30 nm or less.

Thus, studies with respect to a technique for drying a substrate by using a supercritical fluid are being actively carried out so as to supplement the above-described drawbacks.

SUMMARY OF THE INVENTION

The present invention provides a substrate treating apparatus that is capable of recovering a high-purity supercritical fluid from a supercritical fluid containing an organic solvent.

The object of the present invention is not limited to the aforesaid, but other objects not described herein will be clearly understood by those skilled in the art from descriptions below.

Embodiments of the present invention provide substrate treating apparatuses including: a drying chamber in which an organic solvent remaining on a substrate is dissolved by using a fluid that is provided as a supercritical fluid to dry the substrate; a supply unit supplying the fluid into the drying chamber; and a recycling unit including a separator for separating the organic solvent from the fluid discharged from the drying chamber to recycle the fluid, the recycling unit supplying the recycled fluid into the supply unit, wherein the separator includes: a distiller in which a fluid containing an organic solvent having a first concentration is introduced; a heating unit heating a fluid containing an organic solvent having a second concentration discharged from the distiller, the heating unit supplying an evaporated fluid containing an organic solvent having a third concentration into the distiller; and a condensation unit liquefying a fluid containing an organic solvent having a fourth concentration discharged from the distiller, wherein the organic solvent has the second concentration, the first concentration, the third concentration, and the fourth concentration which are successively lowered in concentration.

In some embodiments, the separator may further include a liquefaction unit disposed between the drying chamber and the distiller to liquefy the fluid discharged from the drying chamber, and the liquefaction unit may supply the fluid containing the organic solvent having the first concentration into the distiller.

In other embodiments, the heating unit may include: a heater; a discharge tube connecting the heater to the distiller to supply the fluid containing the organic solvent having the second concentration from the distiller to the heater; a recovery tube supplying the fluid containing the organic solvent having the third concentration, which is heated by the heater, into the distiller; and an organic solvent discharge tube discharging the organic solvent separated from the fluid containing the organic solvent having the second concentration to the outside of the heater.

In still other embodiments, the distiller may further include: a housing; an inflow tube connecting the liquefaction unit to the housing to supply the fluid containing the organic solvent having the first concentration, which is liquefied by the liquefaction unit, to into the housing, wherein the recovery tube may be connected to the housing at a position that is lower than that of the inflow tube.

In even other embodiments, a lower packing member may be disposed between the recovery tube and the inflow tube in the housing, and the fluid containing the organic solvent having the first concentration and the fluid containing the organic solvent having the third concentration may pass through the lower packing member in directions opposite to each other, respectively.

In yet other embodiments, the condensation unit may include: a condenser; an exhaust tube connecting the distiller to the condenser to supply the fluid containing the organic solvent having the fourth concentration into the condenser; and a fluid discharge tube discharging the fluid liquefied in the condenser into the outside of the condenser.

In further embodiments, the distiller may further include a supply tube supplying a fluid containing an organic solvent having a fifth concentration into an upper portion of the distiller, and the fifth concentration may be less than the third concentration.

In still further embodiments, the supply tube may be branched from the fluid discharge tube, and the fifth concentration may be the same as the fourth concentration.

In even further embodiments, the supply tube may further include a pump supplying the fluid from the condenser to the distiller.

In yet further embodiments, the supply tube may be connected to the housing at a position that is higher than the inflow tube.

In much further embodiments, an upper packing member may be disposed between the inflow tube and the supply tube in the housing, and the fluid containing the organic solvent having the third concentration and the fluid containing the organic solvent having the fifth concentration may pass through the upper packing member in directions opposite to each other, respectively.

In still much further embodiments, the condensation unit may include: a condenser; an exhaust tube connecting the distiller to the condenser to supply the fluid containing the organic solvent having the fourth concentration into the condenser; and a fluid discharge tube discharging the fluid liquefied in the condenser into the outside of the condenser.

In even much further embodiments, the distiller may include: a housing; an inflow tube supplying the fluid containing the organic solvent having the first concentration, which is liquefied through the liquefaction unit, into the housing; and a supply tube supplying the fluid containing the organic solvent having the fifth concentration into the housing, wherein the supply tube may be connected to the housing at a position that is higher than that of the inflow tube.

In yet much further embodiments, wherein the supply tube may be branched from the fluid discharge tube, and the fifth concentration may be the same as the fourth concentration.

In much still further embodiments, the supply tube may further include a pump supplying the fluid from the condenser to the distiller.

In even still further embodiments, an upper packing member may be disposed between the inflow tube and the supply tube in the housing, and the fluid containing the organic solvent having the third concentration and the fluid containing the organic solvent having the fifth concentration may pass through the upper packing member in directions opposite to each other, respectively.

In yet still further embodiments, the inflow tube may further include: a valve disposed in the inflow tube; a first sensor measuring a pressure within the distiller; a second sensor measuring a pressure within the liquefaction unit; and a controller receiving signals measured by the first and second sensors to control the valve, wherein the controller may close the valve when the pressure within the liquefaction unit is greater than or equal to that within the distiller.

In much even further embodiments, the organic solvent may include isopropyl alcohol (IPA), and the fluid may include carbon dioxide ($CO_2$).

In other embodiments of the inventive concept, recycling units include: a separator separating an organic solvent from a fluid discharged from a process chamber, wherein the separator includes: a distiller in which a fluid containing an organic solvent having a first concentration is introduced; a heating unit heating a fluid containing an organic solvent having a second concentration discharged from the distiller, the heating unit supplying an evaporated fluid containing an organic solvent having a third concentration into the distiller; and a condensation unit liquefying a fluid containing an organic solvent having a fourth concentration discharged from the distiller, wherein the organic solvent has the second concentration, the first concentration, the third concentration, and the fourth concentration which are successively lowered in concentration.

In some embodiments, the separator may further include a liquefaction unit disposed between the drying chamber and the distiller to liquefy the fluid discharged from the drying chamber, and the liquefaction unit may supply the fluid containing the organic solvent having the first concentration into the distiller.

In other embodiments, the heating unit may include: a heater; a discharge tube connecting the heater to the distiller to supply the fluid containing the organic solvent having the second concentration from the distiller to the heater; a recovery tube supplying the fluid containing the organic solvent having the third concentration, which is heated by the heater, into the distiller; and an organic solvent discharge tube discharging the organic solvent separated from the fluid containing the organic solvent having the second concentration to the outside of the heater.

In still other embodiments, the distiller may further include: a housing; an inflow tube connecting the liquefaction unit to the housing to supply the fluid containing the organic solvent having the first concentration, which is liquefied by the liquefaction unit, to into the housing, wherein the recovery tube may be connected to the housing at a position that is lower than that of the inflow tube.

In even other embodiments, a lower packing member may be disposed between the recovery tube and the inflow tube in the housing, and the fluid containing the organic solvent having the first concentration and the fluid containing the organic solvent having the third concentration may pass through the lower packing member in directions opposite to each other, respectively.

In yet other embodiments, the condensation unit may include: a condenser; an exhaust tube connecting the distiller to the condenser to supply the fluid containing the organic solvent having the fourth concentration into the condenser; and a fluid discharge tube discharging the fluid liquefied in the condenser into the outside of the condenser.

In further embodiments, the distiller may further include a supply tube supplying a fluid containing an organic solvent having a fifth concentration into an upper portion of the distiller, and the fifth concentration may be less than the third concentration.

In still further embodiments, the supply tube may be branched from the fluid discharge tube, and the fifth concentration may be the same as the fourth concentration.

In even further embodiments, the supply tube may be connected to the housing at a position that is higher than the inflow tube.

In yet further embodiments, an upper packing member may be disposed between the inflow tube and the supply tube in the housing, and the fluid containing the organic solvent having the third concentration and the fluid containing the organic solvent having the fifth concentration may pass through the upper packing member in directions opposite to each other, respectively.

In much further embodiments, the condensation unit may include: a condenser; an exhaust tube connecting the distiller to the condenser to supply the fluid containing the organic solvent having the fourth concentration into the condenser; and a fluid discharge tube discharging the fluid liquefied in the condenser into the outside of the condenser.

In still much further embodiments, the distiller may include: a housing; an inflow tube supplying the fluid containing the organic solvent having the first concentration, which is liquefied through the liquefaction unit, into the housing; and a supply tube supplying the fluid containing the organic solvent having the fifth concentration into the housing, wherein the supply tube may be connected to the housing at a position that is higher than that of the inflow tube.

In even much further embodiments, the supply tube may be branched from the fluid discharge tube, and the fifth concentration may be the same as the fourth concentration.

In yet much further embodiments, an upper packing member may be disposed between the inflow tube and the supply tube in the housing, and the fluid containing the organic solvent having the third concentration and the fluid containing the organic solvent having the fifth concentration may pass through the upper packing member in directions opposite to each other, respectively.

In much still further embodiments, the organic solvent may include isopropyl alcohol (IPA), and the fluid may include carbon dioxide ($CO_2$).

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

The invention may, however, be embodied in many different forms and should not be construed as being limited to the embodiments set forth herein; rather, these embodiments are provided so that this disclosure will be thorough and complete, and will fully convey the concept of the invention to those skilled in the art. Moreover, it will be understood that although the terms first and second are used herein to describe various elements, these elements should not be limited by these terms. In the following description of the present invention, a detailed description of known functions and configurations incorporated herein will be omitted to avoid making the subject matter of the present invention unclear.

A substrate treating apparatus 100 according to the present invention may be an apparatus for performing a cleaning process on a substrate S.

Here, the substrate S should be construed as sufficiently comprehensive to include all of various wafers such as silicon wafers, glass substrates, organic substrates, and substrates that are used for manufacturing semiconductor devices, displays, and objects in which a circuit is formed on a thin film.

Hereinafter, the substrate treating apparatus 100 will be described according to an embodiment.

Figure 1:
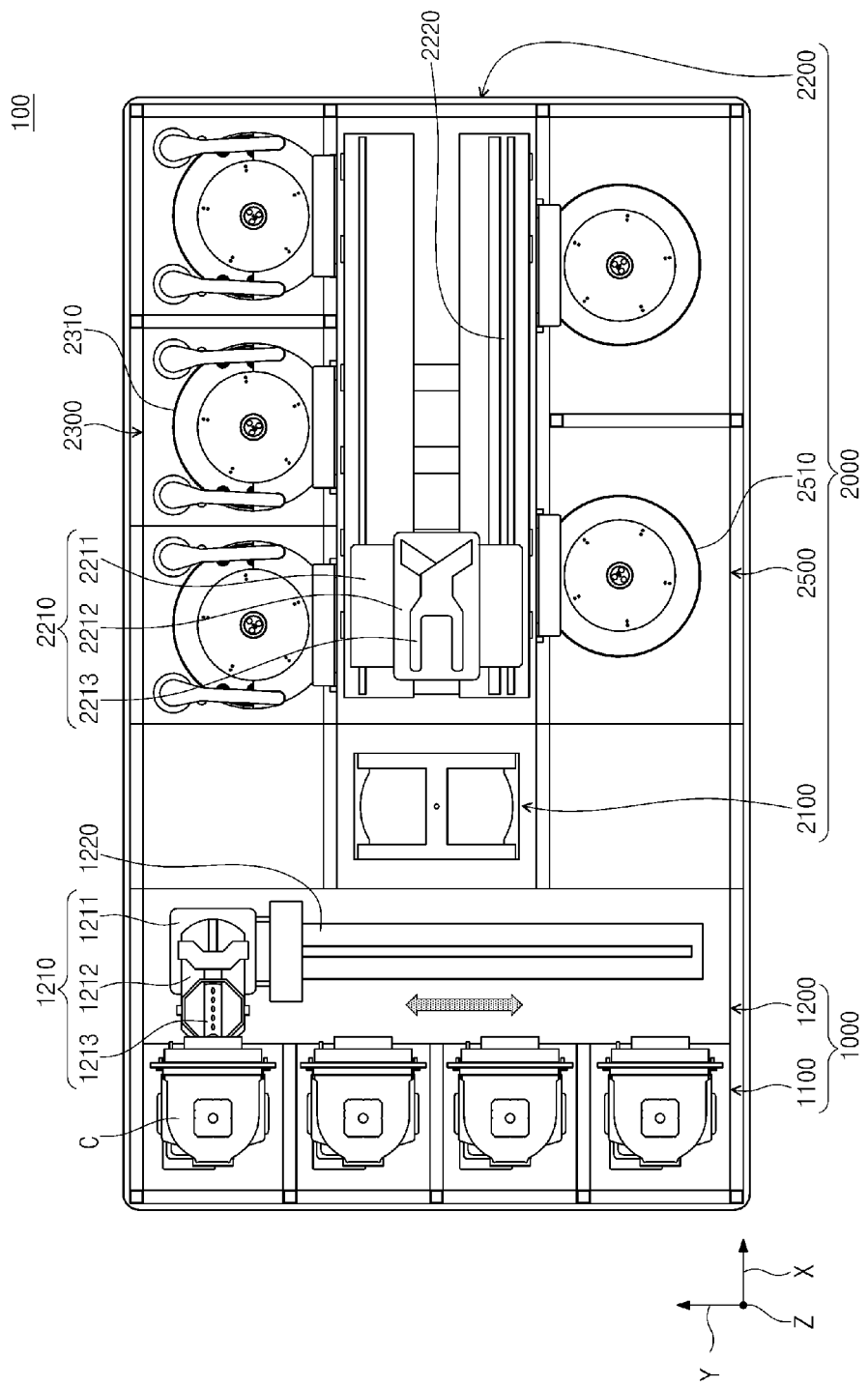
FIG. 1 is a plan view of a substrate treating apparatus according to an embodiment.

FIG. 1 is a plan view of a substrate treating apparatus 100 according to an embodiment.

The substrate treating apparatus 100 includes an index module 1000 and a process module 2000. The index module 1000 receives a substrate S from the outside to provide the substrate S into the process module 2000. The process module 2000 performs a cleaning process on the substrate S.

The index module 100 includes an equipment front end module (EFEM), a loadport 1100, and a transfer frame 1200. The loadport 1100, the transfer frame 1200, and the process module 200 may be successively arranged in a line. Here, a direction in which the loadport 1100, the transfer frame 1200, the process module 2000 are arranged may be referred to as a first direction X. Also, a direction perpendicular to the first direction X when viewed from an upper side may be referred to as a second direction Y, and a direction perpendicular to the first and second direction X and Y may be referred to as a third direction Z.

At least one loadport 1100 may be provided in the index module 1000. The loadport 1100 is disposed on a side of the transfer frame 1200. When the loadport 1100 is provided in plurality, the plurality of loadports 1100 may be arranged in a line along the second direction Y. The number and arrangement of the loadports are not limited to the above-described example. For example, the number and arrangement of the loadports may be adequately controlled in consideration of a foot print and process efficiency of the substrate treating apparatus 100 and a relatively placement of the substrate treating apparatus 100 with respect to the other substrate treating apparatus 100.

A carrier C in which the substrate S is accommodated is placed on the loadport 1100. The carrier C is transferred from the outside and then loaded on the loadport 1100, or is unloaded from the loadport 1100 and then transferred to the outside. For example, the carrier C may be transferred between the substrate treating apparatuses by a transfer device such as an overhead hoist transfer (OHT). Selectively, the transfer of the substrate S maybe performed by the other transfer device such as an automatic guided vehicle or a rail guided vehicle instead of the OHT or a worker. A front opening unified pod (FOUP) may be used as the carrier C.

At least one slot for supporting an edge of the substrate S may be defined in the carrier C. When the slot is provided in plurality, the slots may be spaced apart from each other along the third direction Z. For example, the carrier C may accommodate 25 sheets of substrates. The inside of the carrier C may be isolated and sealed from the outside by an openable door. Thus, it may prevent the substrate S accommodated in the carrier C from being contaminated.

The transfer frame 1200 transfers the substrate S between the carrier seated on the loadport 1100 and the process module 2000. The transfer frame 1200 includes an index robot 1210 and an index rail 1220.

The index rail 1220 guides a linear movement of the index robot 1210. The index rail 1220 may have a longitudinal direction that is parallel to the second direction Y.

The index robot 1210 transfers the substrate S. The index robot 1210 may include a base 1211, a body 1212, and an arm 1213.

The base 1211 is disposed on the index rail 1220. The base 1211 may move along the index rail 1220. The body 1212 is coupled to the base 1211 to move in the third direction Z or rotate by using the third direction Z as a rotation axis on the base 1211. The arm 1213 is disposed on the body 1212 to move forward and backward. A hand may be disposed on an end of the arm 1213 to pick up or out the substrate S. At least one arm 1213 may be provided on the index robot 1210. When the arm 1213 is provided in plurality, the plurality of arms 1213 may be stacked on the body 1212 in the third direction Z. Here, the stacked arms 1213 may be individually driven.

Thus, the base 1211 of the index robot 1210 may move along the index rail 1220 in the second direction Y. As the body 1212 and the arm 1213 operate, the substrate S may be taken out of the carrier C to load the substrate into the process chamber 2000, or the substrate S may be taken out of the process module 2000 and then accommodated into the carrier C.

On the other hand, the index rail 1220 may not be provided on the transfer frame 1200. Thus, the index robot 1210 may be fixed to the transfer frame 1200. Here, the index robot 1210 may be disposed at a center portion of the transfer frame 1200.

The process module 200 performs the cleaning process on the substrate S. The process module 2000 includes a buffer chamber 2100, a transfer chamber 2200, a cleaning chamber 2300, and a drying chamber 2500. The buffer chamber 2100 and the transfer chamber 2200 are disposed in the first direction X, and the transfer chamber 2200 has a longitudinal direction that is parallel to the first direction X. The process chambers 2300 and 2500 are disposed on a side surface of the transfer chamber 2200. The cleaning chamber 2300, the transfer chamber 2200, and the drying chamber 2500 may be successively arranged in the second direction Y.

The cleaning chamber 2300 may be disposed on one side of the transfer chamber 2200 in the second direction Y, and the drying chamber 2500 may be disposed on the other side that is opposite to the cleaning chamber 2300. The cleaning chamber 2300 may be provided in one or plurality. When the cleaning chamber 2300 is provided in plurality, the cleaning chambers 2300 may be arranged on one side of the transfer chamber 2200 in the first direction X, stacked in the third direction Z, or disposed by the combination thereof. Similarly, the drying chamber 2500 may be provided in one or plurality. When the driving chamber 2500 is provided in plurality, the drying chambers 2500 may be arranged on the other side of the transfer chamber 2200 in the first direction X, stacked in the third direction X, or disposed by the combination thereof.

However, the arrangement of the chambers in the process module 2000 is not limited to the above-described example. For example, the arrangement of the chambers may be adequately modified in consideration of the process efficiency. For example, as necessary, the cleaning chamber 2300 and the drying chamber 2500 may be disposed on the side surface, on which the transfer module is disposed, in the first direction X or stacked on each other.

The buffer chamber 2100 is disposed between the transfer frame 1200 and the transfer chamber 2200. The buffer chamber 2100 provides a buffer space in which the substrate S to be transferred between the index module 1000 and the process module 2000 temporarily stays. At least one buffer slot in which the substrate S is placed may be provided in the buffer chamber 2100. When the buffer slot is provided in plurality, the buffer slots may be spaced apart from each other in the third direction Z.

The substrate S that is taken out of the carrier C by the index robot 1210 may be seated on the buffer slot. Also, the substrate S that is taken out of the process chambers 2300 and 2500 by the transfer robot 2210 may be seated on the buffer slot. Also, the index robot 1210 or the transfer robot 2210 may take the substrate S out of the buffer slot to accommodate the substrate S into the carrier C or transfer the substrate S into the process chambers 2300 and 2500.

The transfer chamber 2200 transfers the substrate between the buffer chamber 2100, the cleaning chamber 2300, and the drying chamber 2500. The transfer chamber 2200 includes a transfer rail 2220 and a transfer robot 2210. The transfer rail 2220 provides a path along which the transfer robot 2210 moves. The transfer rail 2220 may be disposed parallel to the first direction X. The transfer robot 2210 transfers the substrate S. The transfer robot 2210 may include a base 2211, a body 2212, and an arm 2213. Since the components of the transfer robot 2210 are similar to those of the index robot 1210, their detailed descriptions will be omitted. The transfer robot 2210 may transfer the substrate S between the buffer chamber 2100, the cleaning chamber 2300, and the drying chamber 2500 by the operations of the body 2212 and the arm 2213 while the base 2211 moves along the transfer rail 2220.

The cleaning chamber 2300 and the drying chamber 2500 may perform different processes on the substrate S. Here, a first process performed in the cleaning chamber 2300 and a second process performed in the drying chamber 2500 may be successively performed. For example, a chemical process, a cleaning process, and a first drying process may be performed in the cleaning chamber 2300, and a second drying process that is a following process of the first process may be performed in the drying chamber 2500. Here, the first drying process may be a drying process that is performed by using an organic solvent, and the second drying process may be a supercritical process that is performed by using a supercritical fluid.

Figure 2:
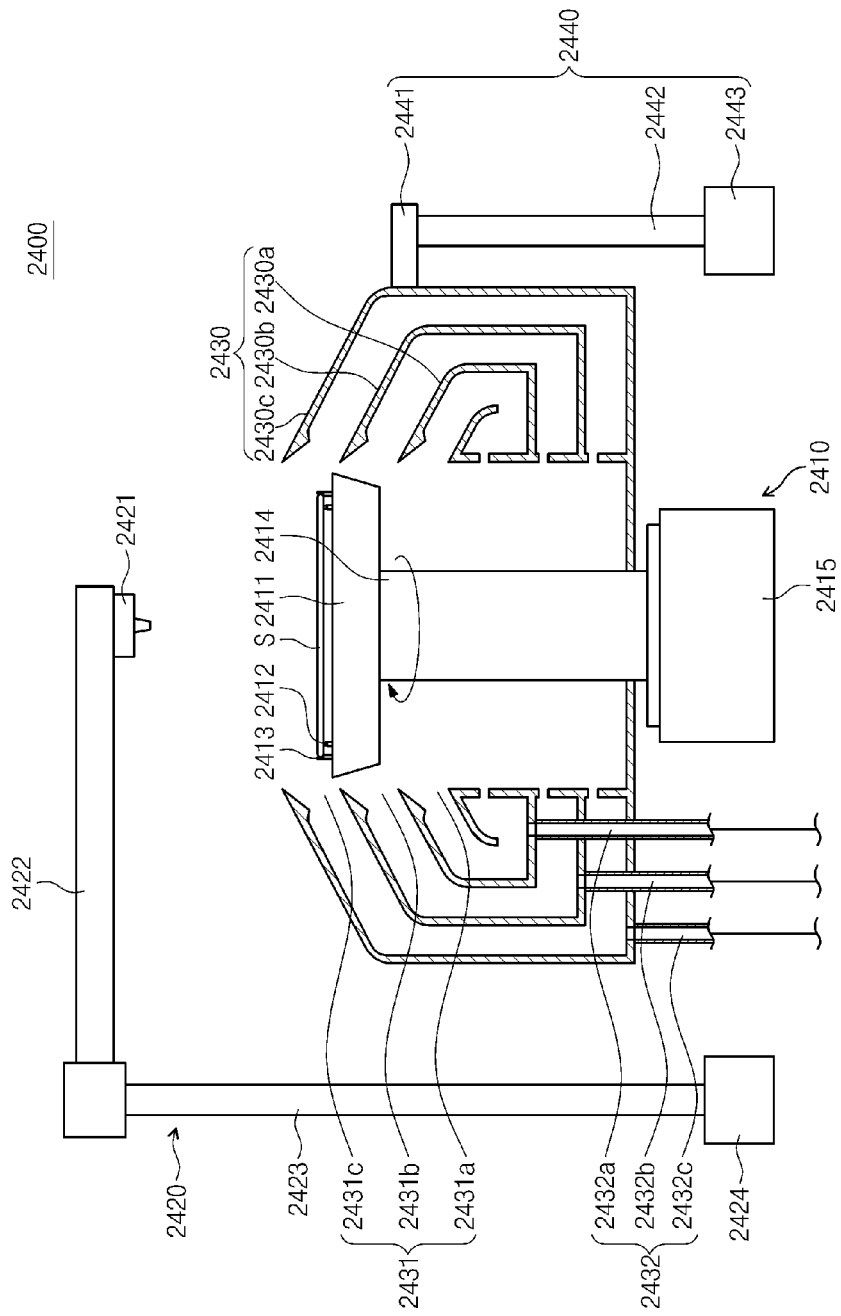
FIG. 2 is a cross-sectional view of a cleaning chamber of FIG. 1.

Hereinafter, the cleaning chamber 2300 will be described. FIG. 2 is a cross-sectional view of the cleaning chamber 2300 of FIG. 1.

The first process is performed in the cleaning chamber 2300. The cleaning chamber 2300 includes a housing 2310 and a process unit 2400. The housing 2310 defines an outer wall of the cleaning chamber 2300. The process unit 2400 is disposed inside the housing 2310 to perform the first process.

The process unit 2400 may include a spin head 2410, a fluid supply member 2420, a recovery box 2430, and an elevation member 2440.

The substrate S is seated on the spin head 2410. The spin head 2410 rotates the substrate S while the process is performed. The spin head 2410 may include a support plate 2411, a support pin 2412, a chucking pin 2413, a rotation shaft 2414, and a motor 2415.

The support plate 2411 may have an upper portion having a shape similar to that of the substrate S. For example, when the substrate includes a circular wafer, the support plate 2411 may have a circular shape. A plurality of support pins 2412 and a plurality of chucking pins 2413 are provided on the support plate 2411. The substrate S is placed on the plurality of support pins 2412. The plurality of chucking pin 2413 fix the substrate S. A rotation shaft 2414 is fixed and coupled to a bottom surface of the support plate 2411. The rotation shaft 2414 rotates by the motor 2415. The motor 2415 may generate a rotation force to rotate the support plate 2411 through the rotation shaft 2414. Thus, the substrate S may be seated on the spin head 2410 to rotate the substrate S while the first process is performed.

The plurality of support pins 2412 protrude from a top surface of the support plate 2411 in the third direction Z. When viewed from an upper side, the support pins 2412 may have an annular ring shape on the whole. A back surface of the substrate S is placed on the support pins 2412. Thus, the substrate S may be seated spaced a distance, by which the support pin 2412 protrudes, from the top surface of the support plate 2411 by the support pins 2412.

The chucking pin 2413 may further protrude from the top surface of the support plate 2411 than the support pin 2412 in the third direction Z. The chucking pin 2413 is disposed far away from a center of the support plate 2411 than the support pin 2412. The chucking pins 2413 may move between a support position and a standby position along a radius direction of the support plate 2411. The support position may be a position that is spaced a distance that corresponds to a radius of the substrate S from the center of the support plate 2411. The standby position may be a position that is far away from the center of the support plate 2411 when compared to the support position. The chucking pin 2413 may be disposed at the standby position when the substrate S is loaded onto or unloaded from the spin head 2410. Also, the chucking pin 2413 may move to the support position while the process is performed. Thus, the chucking pins 2413 may prevent the substrate S from being separated in position by a rotation force thereof when the spin head 2410 rotates.

The fluid supply member 2420 supplies a fluid onto the substrate S. The fluid supply member 2420 includes a nozzle 2421, a support 2422, a support shaft 2423, and a driver 2424. The support shaft 2423 may have a longitudinal direction along the third direction Z. The driver 2424 is coupled to a lower end of the support shaft 2423. The driver 2424 may rotate the support shaft 2423 or vertically move the support shaft 2423 in the third direction Z. The support 2422 is vertically coupled to an upper portion of the support shaft 2423. The nozzle 2421 is disposed on a bottom surface of an end of the support 2422. The nozzle 2421 may move between the support position and the standby position by the rotation and elevation of the support shaft 2423. The support position may be a position that is disposed directly above the support plate 2411. The standby position may be a position that get out of the directly upper side of the support plate 2411.

At least one fluid supply member 2420 may be provided in the process unit 2400. When the fluid supply member 2420 is provided in plurality, the fluid supply member 2420 may supply fluids different from each other. For example, each of the plurality of fluid supply members 2420 may supply a cleaning agent, a rinsing agent, or an organic solvent. The cleaning agent may include hydrogen peroxide ($H_2O_2$), ammonia ($NH_4OH$), hydrogen peroxide ($H_2SO_4$), hydrofluoric acid (HF), or a mixture thereof. The rinsing agent may include deionized water (DI-water), and the organic solvent may include isopropyl alcohol. Selectively, the organic solvent may include ethyl glycol, 1-propanol, tetra hydraulic franc, 4-hydroxyl, 4-methyl, 2-pentanone, 1-butanol, 2-butanol, methanol, ethanol, n-propyl alcohol, or dimethylether. For example, the first fluid supply member 2420a may spray an ammonia-hydrogen peroxide solution, the second fluid supply member 2420b may spray the ID-water, and the third fluid supply member 2420c may spray an isopropyl alcohol solution. However, the organic solvent may not be provided in a liquid state, but provided in a gaseous state. When the organic solvent is provided as vapor having the gaseous state, the organic solvent may be mixed with an inert gas.

The above-described fluid supply member 2420 may move from the standby position to the support position when the substrate S is seated on the spin head 2410 to supply the above-described fluid onto the substrate S. For example, as the fluid supply member supplies the cleaning agent, the rinsing agent, and the organic solvent, the chemical process, the cleaning process, and the first drying process may be performed. While the above-described processes are performed, the spin head 2410 may rotate to uniformly supply the fluids onto the substrate S.

The recovery box 2430 provides a space in which the first process is performed and recovers the fluid that is used in this process. When viewed from an upper side, the recovery box 2430 may be disposed around the spin head 2410 to surround the spin head 2410. Here, the recovery box 2430 may have an opened upper portion. At least one recovery box 2430 may be provided in the process unit 2400. Hereinafter, a case in which three recovery boxes 2430, i.e., a first recovery box 2430a, a second recovery box 2430b, and a third recovery box 2430c are provided will be described as an example. However, the number of recovery boxes 2430 may be differently selected according to the number of fluids and conditions of the first process.

Each of the first recovery box 2430a, the second recovery box 2430b, and the third recovery box 2430c may have an annular ring shape that surrounds the spin head 2410. The first recovery box 2430a, the second recovery box 2430b, and the third recovery box 2430c may be disposed successively away from a center of the spin head 2410. The first recovery box 2340a surrounds the spin head 2410, the second recovery box 2430b surrounds the first recovery box 2430a, and the third recovery box 2430c surrounds the second recovery box 2430b.

A first inflow tube 2431a is provided in the first recovery box 2430a by an inner space of the first recovery box 2430a. A second inflow tube 2431b is provided in the second recovery box 2430b by a space between the first recovery box 2430a and the second recovery box 2430b. A third inflow tube 2431c is provided in the third recovery box 2430c by a space between the second recovery box 2430b and the third recovery box 2430c. The first inflow tube 2431a, the second inflow tube 2431b, and the third inflow tube 2431c may be successively arranged downward from an upper side along the third direction Z. A recovery line 2432 extending downward along the third direction Z is connected to a bottom surface of each of the recovery boxes 2430a, 2430b, and 2430c. Each of the recovery lines 2432a, 2432b, and 2432c may discharge the fluids recovered by the recovery boxes 2430a, 2430b, and 2430c to supply the fluids into an external fluid recycling system (not shown). The fluid recycling system (not shown) may recycle the recovered fluids to reuse the fluids.

The elevation member 2440 includes a bracket 2411, an elevation shaft 2442, and an elevator 2443. The bracket 2441 is fixed to the recovery box 2430. The elevation shaft 2442 moving by the elevator 243 in the third direction Z is fixed and coupled to an end of the bracket 2441. When the recovery box 2430 is provided in plurality, the bracket 2441 may be coupled to the outermost recovery box 2430.

The elevation member 2440 moves the recovery box 2430 in the third direction Z. Thus, when the recovery box 2430 is provided in plurality, a relative height of the recovery box 2430 with respect to the spin head 2410 may be changed to selectively adjust a height of the inflow tube 2431 of any one recovery box 2430 so that the inflow tube 2431 is disposed on a horizontal plane of the substrate S that is seated on the spin head 2410.

Also, the elevation member 2440 may move the recovery box 2430 in the third direction Z while the first process is performed to adjust a height of the inflow tube 2431 of the recovery box 2430 so that the inflow tube 2431 corresponds to the substrate S. Thus, as the substrate S rotates, the fluid bounced off the substrate S may be recovered. For example, when the chemical process that is the first process, the cleaning process using the rinsing agent, and the first drying process using the organic solvent are successively performed, the elevation member 2440 may successively move the first inflow tube 2431a, the second inflow tube 2431b, and the third inflow tube 2431c. Thus, each of the first, second, and third recovery boxes 2430a, 2430b, and 2430c may recover the fluid.

The elevation member 2440 may move the spin head 2410 in the third direction Z instead of the movement of the recovery box 2430.

A second process is performed in the drying chamber 2500. Here, the second process may be a second drying process for drying the substrate S by using a supercritical fluid.

Hereinafter, carbon dioxide ($CO_2$) that is used as the supercritical fluid will be described as an example. However, the present invention is not limited to a kind of supercritical fluid.

Figure 3:
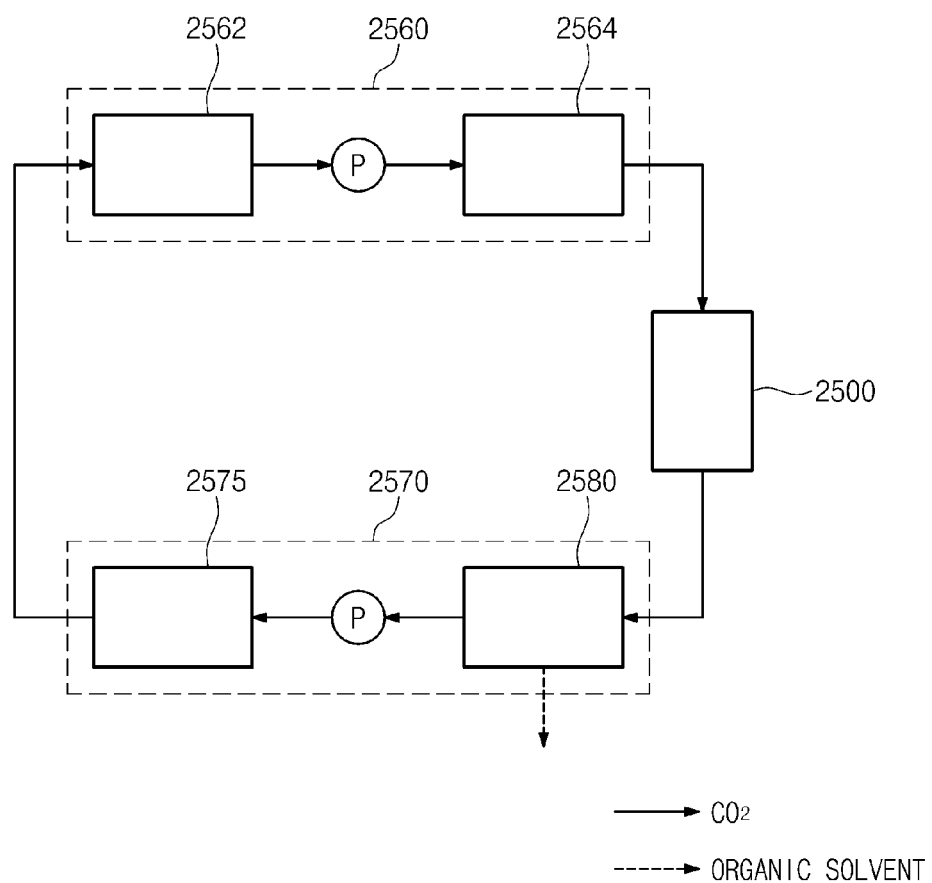
FIG. 3 is a view of a circulation system of a supercritical fluid.

FIG. 3 is a schematic view of the substrate treating apparatus. The substrate treating apparatus 100 includes the drying chamber 2500, a supply unit 2560, and a recycling unit 2570.

Figure 4:
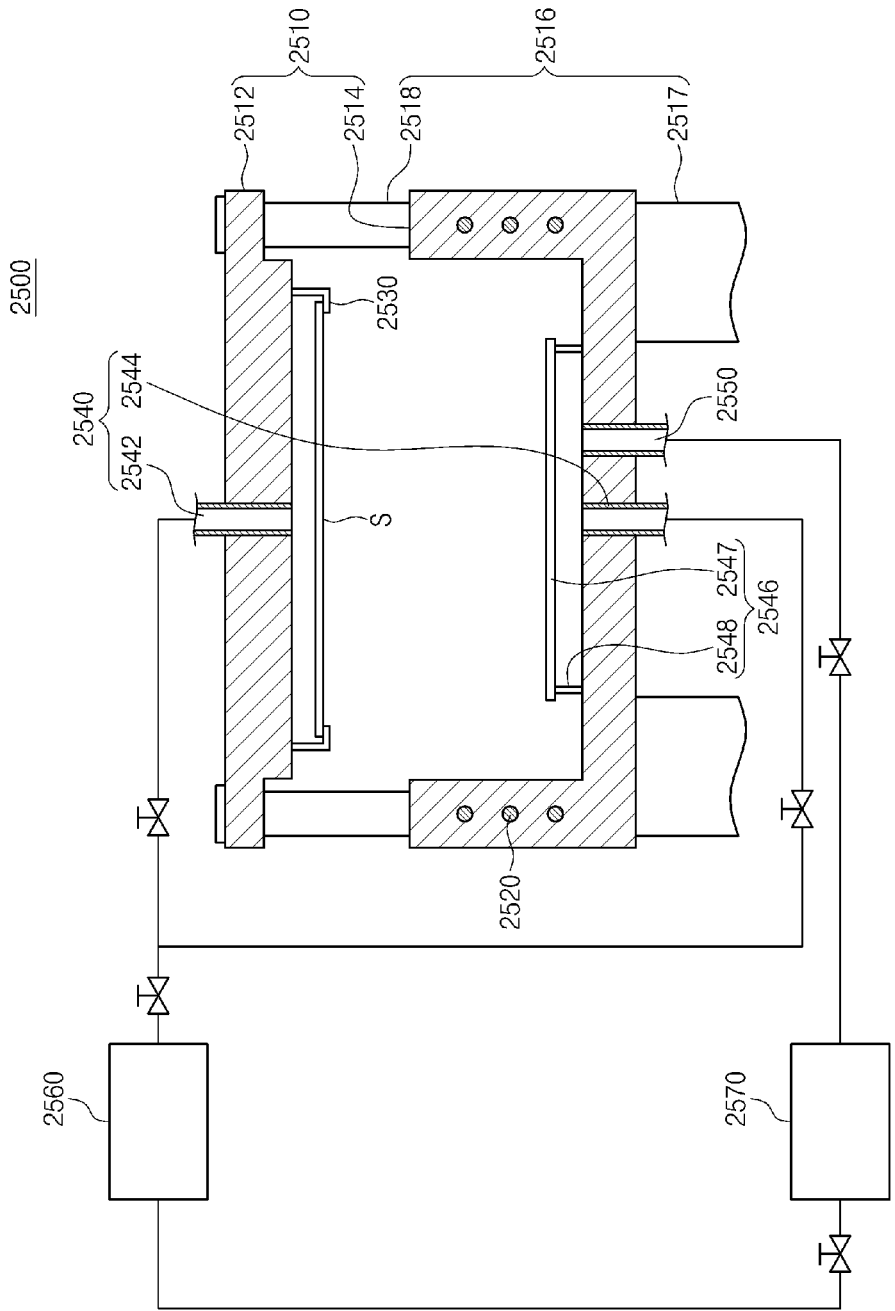
FIG. 4 is a cross-sectional view of a drying chamber of FIG. 1 according to an embodiment.

FIG. 4 is a cross-sectional view of the drying chamber 2500 of FIG. 1 according to an embodiment. Referring to FIG. 4, the drying chamber 2500 may include a housing 2510, an elevation member 2516, a support member 2530, a heating member 2520, a supply port 2540, a blocking member 2546, and an exhaust port 2550.

The housing 2510 may provide a space in which a supercritical drying process is performed. The housing 2510 may be formed of a material that is capable of enduring a high pressure greater than a critical pressure.

The housing 2510 includes an upper housing 2512 and a lower housing 2514.

The upper housing 2512 is fixed, and the lower housing 2514 may be elevated with respect to the upper housing 2512. When the lower housing 2514 descends and then is spaced from the upper housing 2512, an inner space of the drying chamber 2500 may be opened. Thus, the substrate S may be loaded into or unloaded from the inner space of the drying chamber 2500. Here, the substrate S loaded into the drying chamber 2500 may be in a state in which the organic solvent remains after an organic solvent process is performed in the cleaning chamber 3000. Also, when the lower housing 2514 ascends and then is closely attached to the upper housing 2512, the inner space of the drying chamber 2500 may be sealed, and the supercritical drying process may be performed in the inner space. Unlike the above-described example, the lower housing 2514 may be fixed to the housing 2510, and the upper housing 2512 may be elevated with respect to the lower housing 2514.

The elevation member 2516 elevates the lower housing 2514. The elevation member 2516 may include an elevation cylinder 2517 and an elevation rod 2518. The elevation cylinder 2517 is coupled to the lower housing 2514 to generate a vertical driving force.

The support member 2530 supports the substrate S between the upper housing 2512 and the lower housing 2514. The support member 2530 may be disposed on a bottom surface of the upper housing 2512 to extend directly downward. Also, the support member 2530 may be perpendicularly bent from a lower end of the upper housing 2512 in a horizontal direction. Thus, the support member 2530 may support an edge area of the substrate S. As described above, since the support member 2530 contacts the edge region of the substrate S to support the substrate S, the supercritical drying process may be performed on an entire area of a top surface of the substrate S and most areas of a bottom surface of the substrate S. Here, the top surface of the substrate S may be a pattern surface, and the bottom surface of the substrate S may be a non-pattern surface. Also, since the fixed upper housing 2512 is provided, the support member 2530 may relatively stably support the substrate S while the lower housing 2514 is elevated.

A horizontal adjustment member 2532 may be disposed in the upper housing 2512. The horizontal adjustment member 2532 may adjust horizontality of the upper housing 2512. When the upper housing 2512 is adjusted in horizontality, the substrate S seated on the support member 2530 disposed in the upper housing 2512 may be adjusted in horizontality. When the substrate S is tilted in the supercritical drying process, the organic solvent remaining on the substrate S may flow along a sloop to cause a phenomenon in which a specific portion of the substrate S is not dried or overdried, thereby damaging the substrate S. The horizontal adjustment member 2532 may adjust horizontality of the substrate S to prevent the above-described phenomenon from occurring.

The heating member 2520 may heat the inside of the drying chamber 2500. The heating member 2520 may heat the supercritical fluid supplied into the drying chamber 2500 at a temperature greater than a critical temperature to maintain the supercritical fluid to a supercritical fluid state or change the supercritical fluid again into the supercritical fluid state if the supercritical fluid is liquefied. The heating member 2520 may be buried in at least one wall of the upper and lower housings 2512 and 2514. For example, the heating member 2520 may be provided as a heater for receiving a power from the outside to generate heat.

The supply port 2540 supplies the supercritical fluid to the drying chamber 2500. The supply port 2540 may be connected to the supply unit 2560. A valve for adjusting a flow rate of the supercritical fluid supplied from the supply unit 2560 may be disposed in the supply port 2540.

The supply port 2540 may include an upper supply port 2542 and a lower supply port 2544. The upper supply port 2542 may be provided in the upper housing 2512 to supply the supercritical fluid onto the top surface of the substrate S. The lower supply port 2544 may be provided in the lower housing 2514 to supply the supercritical fluid onto the bottom surface of the substrate S that is supported by the support member 2530.

The supply ports 2540 may spray the supercritical fluid onto a central area of the substrate S. The upper supply port 2542 may be disposed at a position that faces a center of the top surface of the substrate S supported by the support member 2530. Also, the lower supply port 2544 maybe disposed at a position that faces a center of the bottom surface of the substrate S supported by the support member 2530.

The supercritical fluid may be supplied first into the housing 4510 through the lower supply port 2544 and then supplied into the housing 2510 through the upper supply port 2542. Since the supercritical drying process is performed in a state where an internal pressure of the drying chamber 2500 is less than the critical pressure, the supercritical fluid supplied into the drying chamber 2500 may be in a liquefied state. Thus, when the supercritical fluid is supplied into the upper supply port 2542 during an initial supercritical drying process, the supercritical fluid may be liquefied to drop onto the substrate S by gravity, thereby damaging the substrate S. The upper supply port 2542 may start the supply of the supercritical fluid, when the supercritical fluid is supplied into the drying chamber 2500 through the lower supply port 2544 to allow the internal pressure of the drying chamber 2500 to reach the supercritical pressure, to liquefy the supercritical fluid, thereby preventing the supercritical fluid from dropping onto the substrate S.

The blocking member 2546 may include a blocking plate 2547 and a support 2548. The blocking plate 2547 is disposed between the supply port 2540 and the substrate S supported by the support member 2530. The blocking plate 2547 may prevent the supercritical fluid supplied through the lower supply port 2544 from being directly sprayed onto the bottom surface of the substrate S. Thus, the blocking plate 2547 may block the direct spraying of the supercritical fluid onto the substrate S to prevent the substrate from being damaged by a physical force of the supercritical fluid. The blocking plate 2547 may have a radius similar to or greater than that of the substrate S. Selectively, the blocking plate 2547 may have a radius less than that of the substrate S. The support 2548 supports the blocking plate 2547. The blocking plate 2547 may be disposed on an end of the support 2548. The support 2548 may extend directly upward from the bottom surface of the housing 2510.

After the process is performed, the supercritical fluid may be exhausted into the recycling unit 2570 through the exhaust port 2550.

The second drying process is performed in the drying chamber 2500 by using the supercritical fluid. For example, the second drying process may be performed on the substrate S, on which the chemical process, the cleaning process, and the first drying process using the organic solvent are successively performed in the cleaning chamber 2300, by using the supercritical fluid in the drying chamber 2500. When the substrate S is seated on the support member 2530 by the transfer robot 2210, the heating member 2520 heats the inside of the housing 2510 to supply the supercritical fluid through the supercritical fluid supply tube 2540. As a result, a supercritical atmosphere may be formed in the housing 2510. When the supercritical atmosphere is formed, the organic solvent remaining on a top surface of the pattern of the substrate S may be dissolved by the supercritical fluid. When the organic solvent is sufficiently dissolved, the supercritical fluid may be discharged through a discharge hole. Thereafter, the supercritical fluid is supplied again into the supply unit 2560. That is, the supply unit 2560 supplies the supercritical fluid into the drying chamber 2500, and the recycling unit 2570 recycles the supercritical fluid that is used in the drying chamber to supply the recycled supercritical fluid into the supply unit 2560.

Referring again to FIG. 3, the supply unit 2560 may include a condenser 2562, a pump P, and a water supply tank 2564. The condenser 2562, the pump P, and the water supply tank 2564 may be successively connected to each other in series.

The carbon dioxide supplied from the outside or the recycling unit 2570 may be a gaseous state. The condenser 2562 may change the carbon dioxide into a liquid state to supply the liquefied carbon dioxide into the water supply tank 2564. The pump P may be disposed between the condenser 2562 and the water supply tank 2564. The pump P supplies the liquefied carbon dioxide into the water supply tank 2564. The water supply tank 2562 receives the carbon dioxide liquefied in the condenser 2562 to generate the supercritical fluid. The water supply tank 2564 may heat the supplied carbon dioxide to a temperature greater than the critical temperature to generate the supercritical fluid, thereby supplying the supercritical fluid into the drying chamber 2500. Here, the carbon dioxide discharged from the water supply tank 2564 may have a pressed pressure of about 100 bar to about 150 bar.

Figure 5:
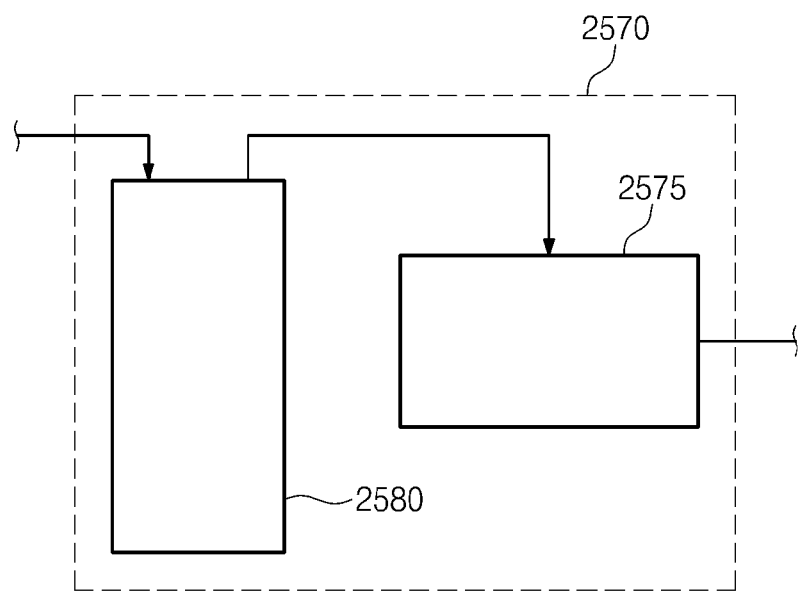
FIG. 5 is a view of a recycling unit of FIG. 3.

FIG. 5 is a cross-sectional view of the drying chamber 2570 of FIG. 4 according to an embodiment.

The recycling unit 2570 includes a separator 2580 and a recycler 2575. The recycling unit 2570 may recycle the supercritical fluid, which is used for the second drying process in the drying chamber 2500 containing the organic solvent, to supply the supercritical fluid into the supply unit 2560. The separator 2580 may cool the carbon dioxide to liquefy the organic solvent contained in the carbon dioxide, thereby primarily separating the organic solvent from the carbon dioxide. The recycler 2590 may allow the carbon dioxide to pass through a space in which an absorbent A for absorbing the organic solvent is provided, thereby secondarily separating the organic solvent from the carbon dioxide.

Figure 6:
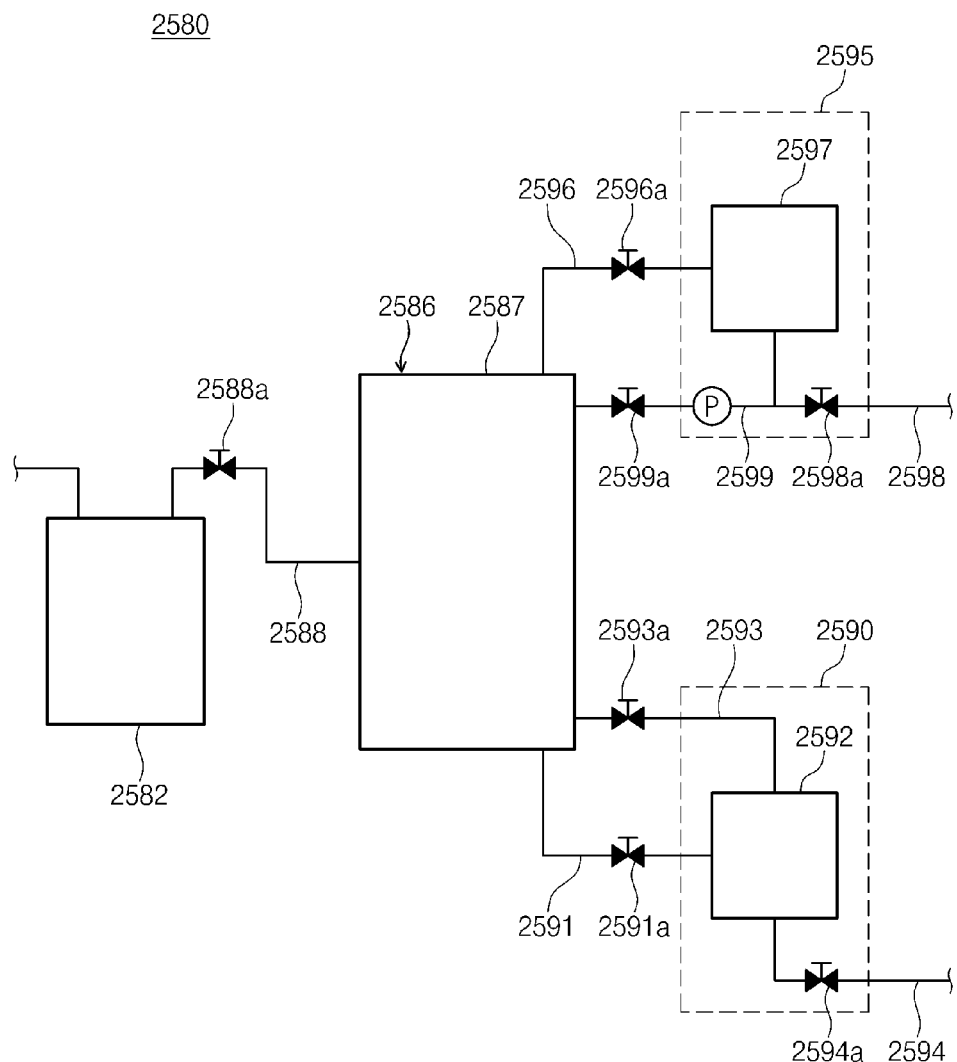
FIG. 6 is a view of a separator of FIG. 5.
Figure 7:
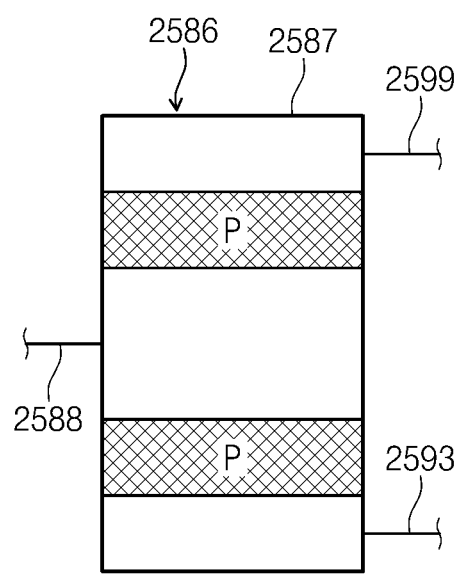
FIG. 7 is a view illustrating the inside of the separator of FIG. 6.

FIG. 6 is a view of the separator 2580 of FIG. 5. FIG. 7 is a cross-sectional of the separator 2580 of FIG. 5. The separator 2580 includes a liquefaction unit 2582, a distiller 2586, a heating unit 2590, and a condensation unit 2595.

The liquefaction unit 2582 is disposed between the drying chamber 2500 and the distiller 2586. The liquefaction unit 2582 liquefies the carbon dioxide. The carbon dioxide discharged from the drying chamber 2500 is supplied into the liquefaction unit 2582 through an inflow tube 2583. The liquefaction unit 2582 supplies the carbon dioxide into the distiller 2586. Also, the liquefaction unit 2582 continuously supplies a predetermined amount of carbon dioxide into the distiller 2586.

The distiller 2586 includes a housing 2587 and an inflow tube 2588. The housing 2587 provides a space in which the carbon dioxide containing the organic solvent is fractionally distillated. The inflow tube 2588 connects the liquefaction unit 2582 to the distiller 2586. The carbon dioxide liquefied in the liquefaction unit 2582 is introduced into the distiller 2586 through the inflow tube 2588. The carbon dioxides may be heat-exchanged with each other in the housing 2587. A packing member P is provided inside the housing 2587. The carbon dioxide may pass through the packing member P and thus be spread into an entire region. Thus, the heat-exchange of the carbon dioxide may be occurred in a wider region. Also, since the carbon dioxide is reduced in speed while passing through the packing member P, the heat exchange may be realized over a wider region. Referring to FIG. 7, a recovery tube 2593 is connected to the housing 2587 at a height that is lower than that of the inflow tube 2588. Here, a lower packing member P may be disposed between the inflow tube 2588 and the recovery tube 2593. Referring to FIG. 7, a supply tube 2599 is connected to the housing 2587 at a height that is higher than that of the inflow tube 2588. An upper packing member P may be provided between the supply tube 2593 and the inflow tube 2588. A valve 2588a is disposed in the inflow tube 2588.

The heating unit 2590 includes a discharge tube 2591, a heater 2592, a recovery tube 2593, and an organic solvent discharge tube 2594. The discharge tube 2591 connects the heater 2592 to the distiller 2586. The discharge tube 2591 supplies the carbon dioxide discharged from the distiller 2586 to the heater 2592. The heater 2592 heats the carbon dioxide. The recovery tube 2593 connects the heater 2592 to the distiller 2586. The carbon dioxide that is heated in the heater 2592 and then evaporated is supplied again into the distiller 2586 through the recovery tube 2593. The separated organic solvent is discharged to the outside of the heater 2592 through the organic solvent discharge tube 2594. Valves 2591a, 2593a, and 2594a are disposed in the discharge tube 2591, the recovery tube 2593, and the organic solvent discharge tube 2594, respectively.

The condensation unit 2595 includes an exhaust tube 2596, a condenser 2597, a fluid discharge tube 2598, and a supply tube 2599. The exhaust tube 2596 connects the condenser 2597 to the distiller 2586. The supply tube 2599 connects the condenser 2597 to the distiller 2586. The carbon dioxide fractionally distillated in the distiller 2586 is supplied into the condenser 2597 through the exhaust tube 2596. The gaseous carbon dioxide is condensed in the condenser 2597. Referring to FIG. 6, the supply tube 2599 may be branched from the fluid discharge tube 2598. A portion of the carbon dioxide condensed in the condenser 2597 is supplied into the recycler 2575 through the fluid discharge tube 2598. The other portion of the carbon dioxide condensed in the condenser 2597 is supplied again into the distiller 2586 through the supply tube 2599. Here, the supply tube 2599 may further include a pump P for supplying the carbon dioxide from the condenser 2597 to the distiller 2586. Valves 2596a, 2598a, and 2599a are disposed in the exhaust tube 2596, the fluid discharge tube 2598, and the supply tube 2599.

Figure 8:
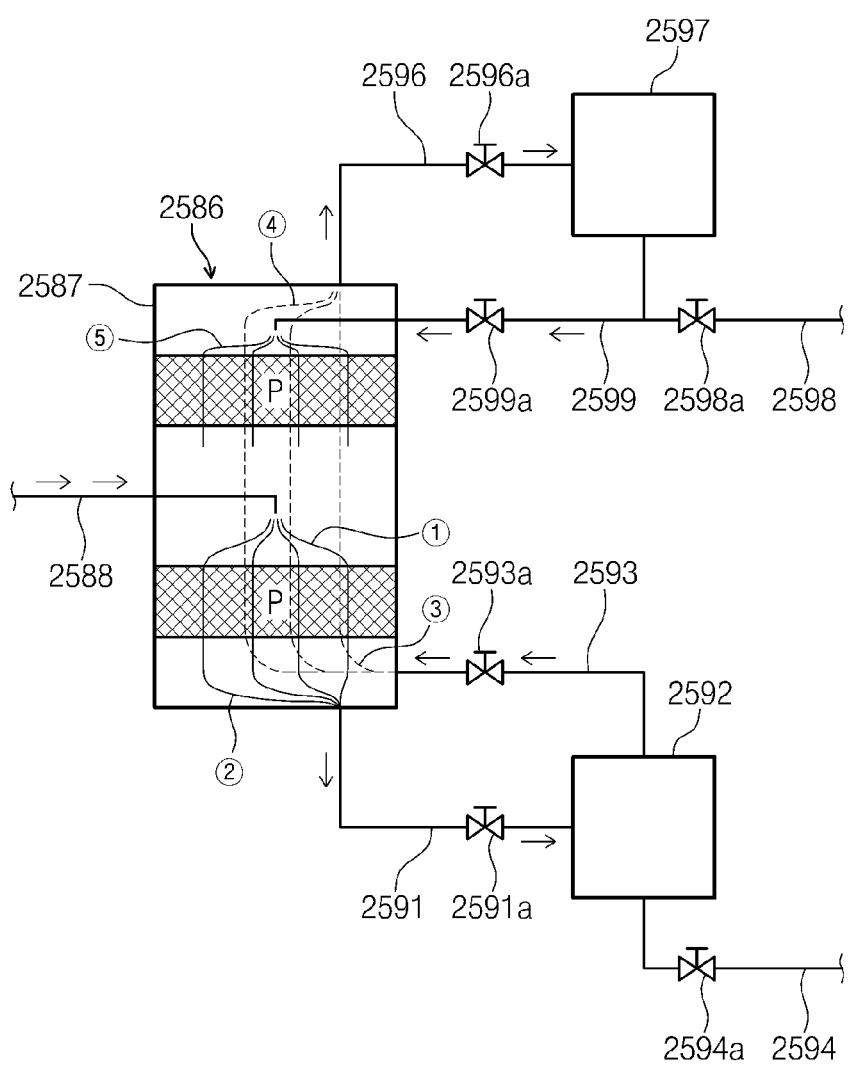
FIGS. 8 and 9 are views illustrating a recycling process of the separator of FIG. 6.
Figure 9:
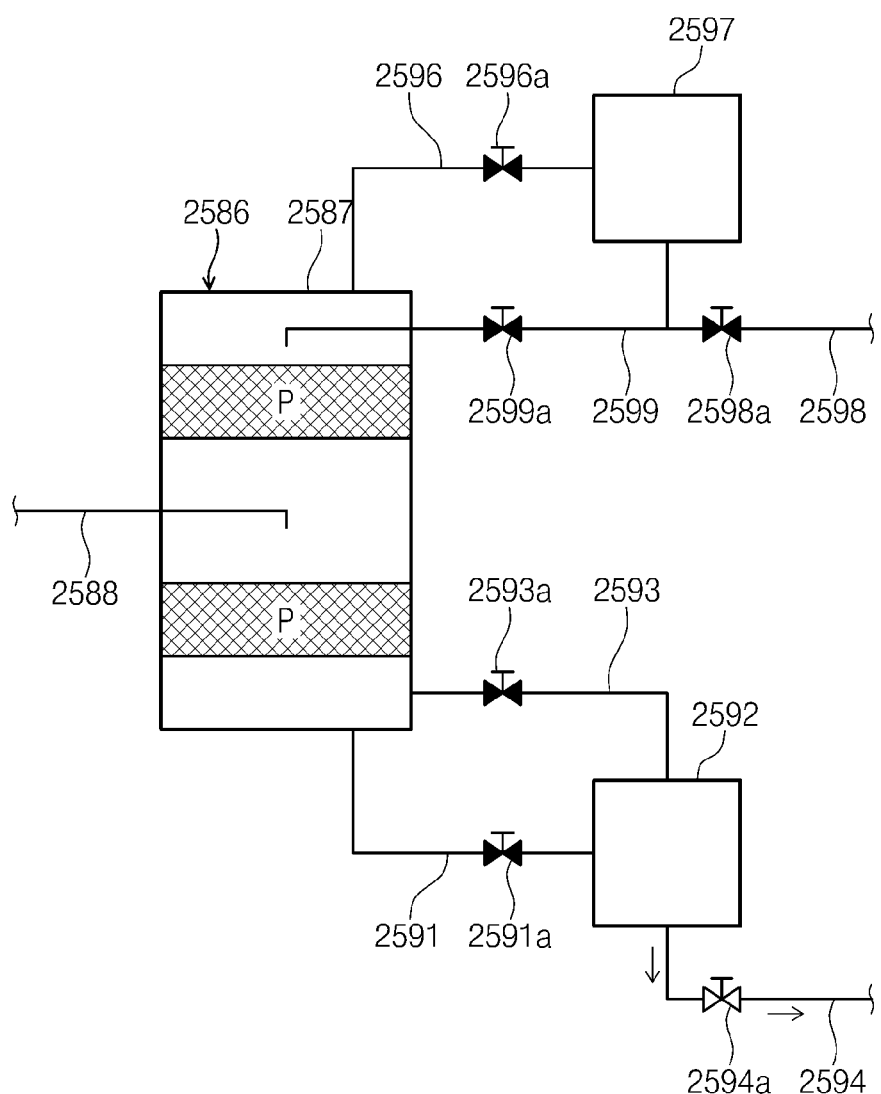

FIGS. 8 and 9 are views illustrating a process in which the carbon dioxide containing the organic solvent is recycled by using the separator. An arrow represents a flow of the fluid. A valve of which the inside is filled represents a closed valve, and a valve of which the inside is empty represents an opened valve. First, carbon dioxide (see reference numeral ① of FIG. 8) is introduced into the distiller 2586 through the inflow tube 2588. Here, the carbon dioxide contains an organic solvent having a first concentration. The carbon dioxide containing the organic solvent having the first concentration, which is flowed in through the inflow tube 2588 is spread and supplied through the lower packing member P. While the carbon dioxide containing the organic solvent having the first concentration passes through the lower packing member P, the carbon dioxide is heat-exchanged with carbon dioxide (see reference numeral ③ of FIG. 8) containing an organic solvent having a third concentration, which is supplied through the recovery tube 2593 to reversely pass through the lower packing member P. Here, a portion of the carbon dioxide containing the organic solvent having the first concentration is evaporated. Thus, a portion of the organic solvent may be separated, and then, a carbon dioxide (see reference numeral ② of FIG. 8) containing an organic solvent having a second concentration is supplied into a lower portion of the lower packing member P. Here, the second concentration is greater than the first concentration. The carbon dioxide containing the organic solvent having the second concentration is supplied into the heater 2592 through the discharge tube 2591. The carbon dioxide containing the organic solvent having the second concentration is heated in the heater 2592 at a temperature that is greater than a boiling point of the carbon dioxide and less than a boiling point of the organic solvent. Thus, the carbon dioxide is evaporated in the heater 2592. Thus, the carbon dioxide containing the organic solvent having the third concentration is generated. The carbon dioxide containing the organic solvent having the third concentration is supplied again into the distiller 2586 through the recovery tube 2593. The carbon dioxide (see reference numeral ③ of FIG. 8) containing the organic solvent having the third concentration meets the carbon dioxide containing the organic solvent having the first concentration within the distiller 2586. In this process, the liquefied carbon dioxide (see reference numeral ① of FIG. 8) containing the organic solvent having the first concentration is heat-exchanged with the evaporated carbon dioxide (see reference numeral ③ of FIG. 8) containing the organic solvent having the third concentration to evaporate a portion of the carbon dioxide containing the organic solvent having the first concentration. Thus, the carbon dioxide containing the organic solvent having the third concentration, which passes through the lower packing member P, is supplied into the upper packing package P. Here, the carbon dioxide passing through the lower packing member P may be provided at a concentration that is lower than the third concentration. The carbon dioxide containing the organic solvent having the third concentration, which is supplied into the upper packing member P meets a carbon dioxide (see reference numeral ⑤ of FIG. 8) containing an organic solvent having a fourth concentration, which is supplied into the supply tube 2599. Thus, the carbon dioxide containing the organic solvent having the third concentration and carbon dioxide containing an organic solvent having a fourth concentration are heat-exchanged while reversely passing through the upper packing member P. Since the carbon dioxide containing the organic solvent having the fourth concentration is in a liquid state, a portion of the organic solvent contained in the carbon dioxide containing the organic solvent having the third concentration is liquefied and separated. Thus, the carbon dioxide (see reference numeral ④ of FIG. 8) containing the organic solvent having the fourth concentration is supplied into the exhaust tube 2596 disposed above the distiller 2586. The carbon dioxide containing the organic solvent having he fourth concentration is supplied into the condenser 2597 and condensed. A portion of the carbon dioxide containing the organic solvent having the fourth concentration, which is liquefied in the condenser 2597 is supplied into the recycler 2575 through the fluid discharge tube 2598. A remaining portion (see reference numeral ⑤ of FIG. 8) of the carbon dioxide containing the organic solvent having the fourth concentration may be supplied again into the distiller 2586 through the supply tube 2599. In this process, the organic solvent may have the second concentration, the first concentration, the third concentration, and the fourth concentration, which are successively lowered in concentration. When the organic solvent separation process is finished, as shown in FIG. 9, the organic solvent is discharged to the outside of the heater 2592 through the organic solvent discharge tube 2594.

Figure 10:
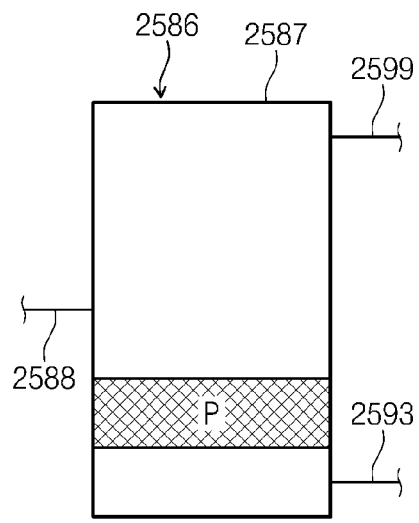
FIGS. 10 and 11 are views illustrating a modified example of the inside of the separator FIG. 7.
Figure 11:
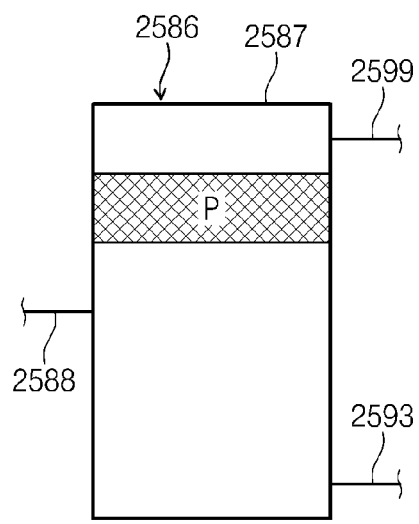

Although the packing member P is disposed on each of the upper and lower portions of the distiller 2586 in the current embodiment, the present invention is not limited thereto. For example, the packing member P may be disposed on the lower portion between the inflow tube 2588 and the recovery tube 2593. Also, as shown in FIG. 11, the packing member P may be provided on the upper portion between the inflow tube 2588 and the supply tube 2599 (see FIG. 10). Also, only one of the heating unit 2590 and the condensation unit 2595 may be provided.

Figure 12:
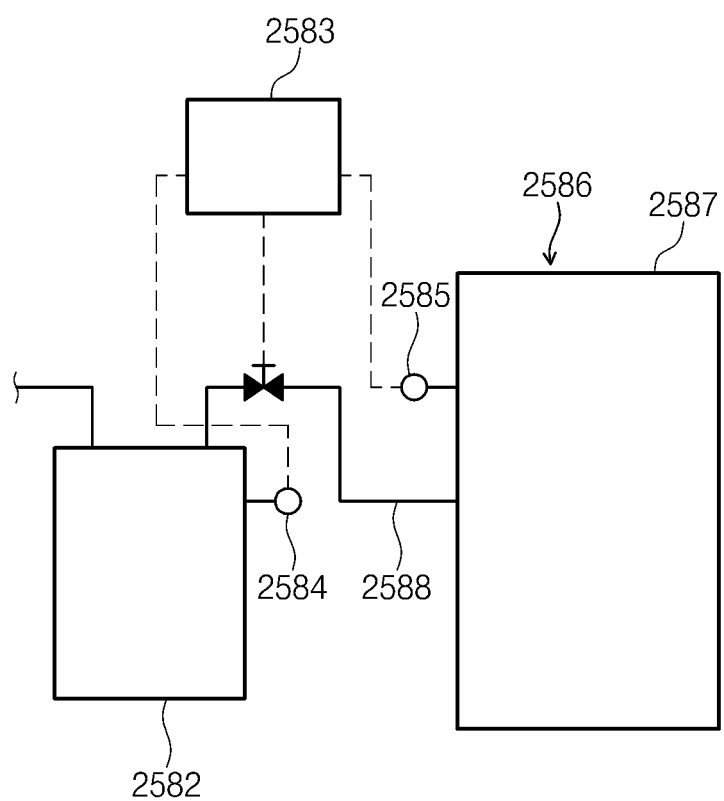
FIG. 12 is a view of a separator according to another embodiment.

Also, referring to FIG. 12, the inflow tube 2588 may include a valve 2588a, a first sensor 2584, a second sensor 2585, and a controller 2583. The valve 2588a is disposed in the inflow tube 2588. The first sensor measures an internal pressure of the housing 2587. The second sensor 2585 measures an internal pressure of the liquefaction unit 2582. The controller receives signals measured by the first and second sensors 2584 and 2585 to control the valve 2588a. Here, the controller 2583 may compare internal pressures of the liquefaction unit 2582 and the distiller 2586 to each other. As a result, when the internal pressure of the liquefaction unit 2582 is greater than or equal to that of the distiller 2586, the valve 2588a may be closed to stop the supply of the carbon dioxide.

Figure 13:
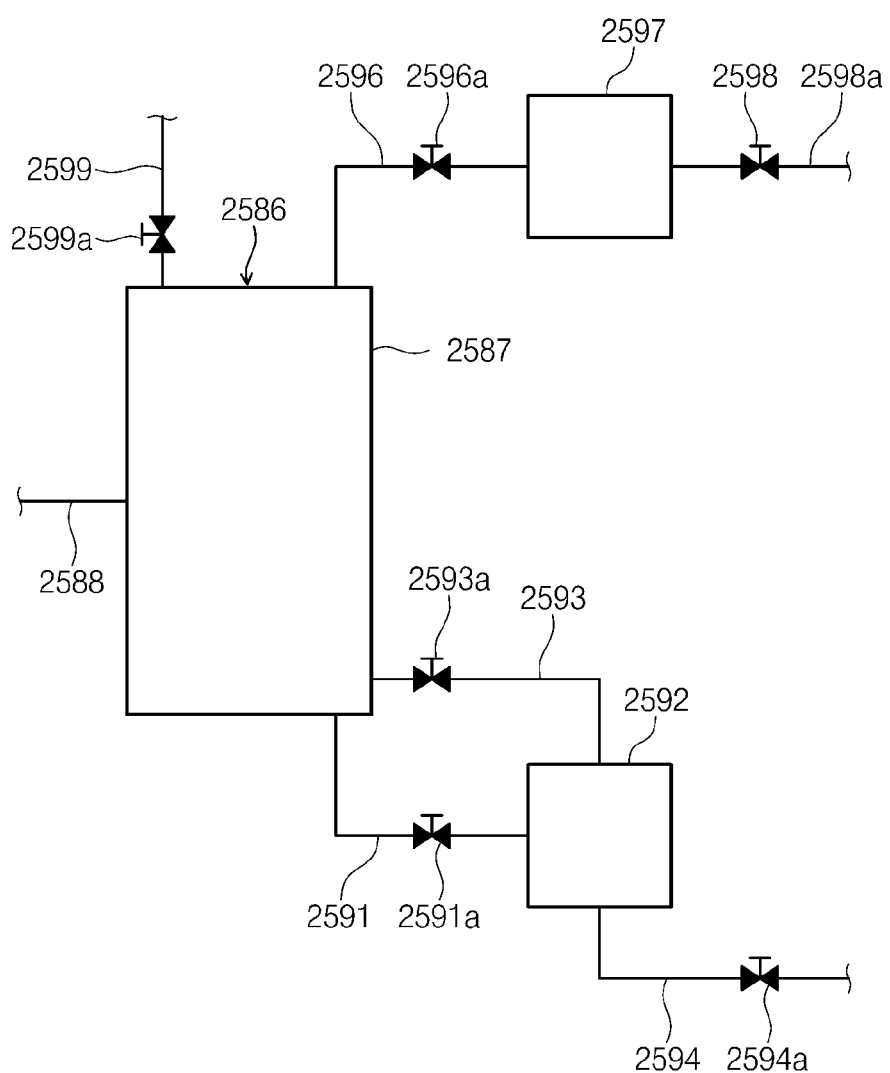
FIG. 13 is a view illustrating a modified example of the separator FIG. 5.

FIG. 13 is a view illustrating a modified example of the separator 2580.

Referring to FIG. 13, the separator 2580 include a liquefaction unit 2582, a distiller 2586, a heating unit 2590, and a condensation unit 2595. Each of the liquefaction unit 2582, the distiller 2586, and the heating unit 2590 of FIG. 13 may have substantially the same as or equal to the liquefaction unit 2582, the distiller 2586, and the heating unit 2590 of FIG. 6. However, a supply tube 2599 is independently provided with respect to the fluid discharge tube 2598. Here, the supply tube 2599 may supply carbon dioxide containing an organic solvent having a fifth concentration into the distiller 2586. The fifth concentration is less than the third concentration.

Figure 14:
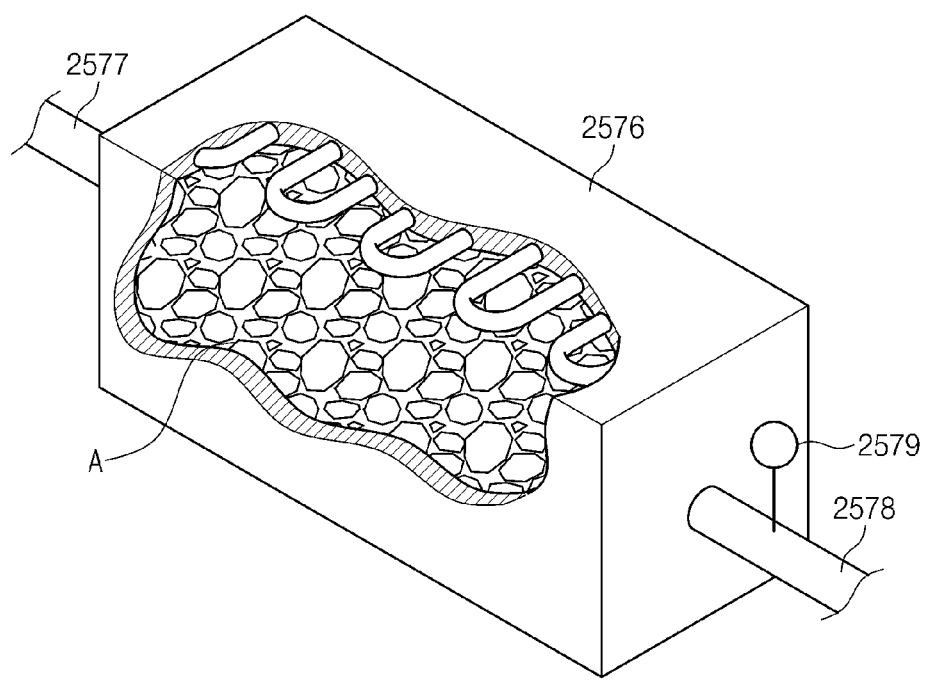
FIG. 14 is a view of a recycler of FIG. 5.

FIG. 14 is a cross-sectional of the recycler 2575 of FIG. 5. The recycler 2575 may include a column 2576, an inflow tube 2577, an exhaust tube 2978, and a concentration sensor 2979.

The column 2976 has a space in which an absorbent is provided therein. Referring to FIG. 14, the absorbent A is provided in the column 2591. The absorbent A has a plurality of pores to absorb the organic solvent in the pores. For example, zeolite may be used as the absorbent. While the carbon dioxide passes through the column 2976, the absorbent A absorbs the organic solvent from the carbon dioxide. Thus, the organic solvent contained in the carbon dioxide may be removed to recycle the carbon dioxide. The inflow tube 2977 connects the separator 2580 to the column 2976. The carbon dioxide is introduced into the column 2976 through the inflow tube 2977. The carbon dioxide is discharged to the exhaust tube 2978 through the column 2976. The concentration sensor is disposed in the exhaust tube 2578. The concentration sensor 2979 may detect a concentration of the organic solvent contained in the carbon dioxide that is discharged from the column 2976. The recycled carbon dioxide is supplied into the supply unit 2560 through the exhaust tube 2578.

Figure 15:
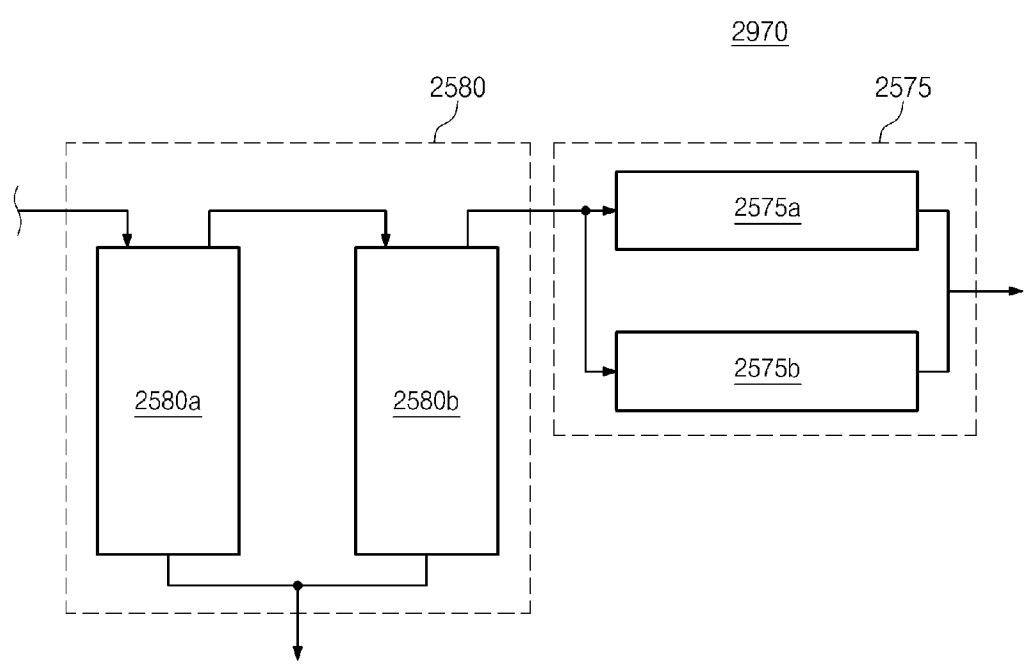
FIGS. 15 and 16 are views illustrating a modified example of the recycling unit of FIG. 5.
Figure 16:
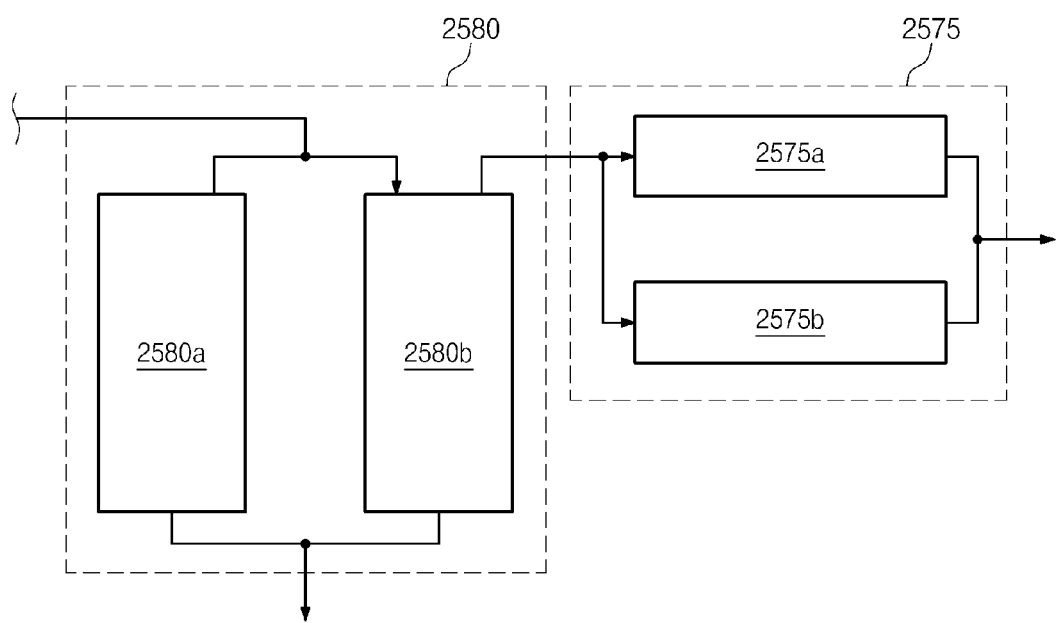

On the other hand, the recycling unit 2570 may include a plurality of separators 2580. Here, as shown in FIG. 15, the separators 2580 may be connected to each other in series. A first separator 2580*a* primarily separates the carbon dioxide and the organic solvent from each other. Then, a second separator 2580*b* is connected to the first separator 2580*a* to secondarily separate the carbon dioxide and the organic solvent from each other. Thus, the separation of the organic solvent may be performed several times to obtain more pure carbon dioxide. Also, as shown in FIG. 16, the separator 2580 may be connected to each other in parallel. Thus, the first and second separators 2580*a* and 2580*b* may separate the carbon dioxide and the organic solvent from each other at the same time to treat more amount of carbon dioxide. Also, the recycler 2575 may be provided in plurality.

Although the separator 2580 is connected to the recycler 2575 in the recycling unit 2570, the present invention is not limited thereto. For example, when the recycler 2575 is omitted, the separator 2580 may be directly connected to the supply unit 2560.

According to the embodiment of the present invention, the high-purity supercritical fluid may be recovered or recycled.

The object of the present invention is not limited to the aforesaid, but other objects not described herein will be clearly understood by those skilled in the art from descriptions below.

The present invention has been described above with reference to the aforementioned embodiments. It is evident, however, that many alternative modifications and variations will be apparent to those having skill in the art in light of the foregoing description. Accordingly, the present invention embraces all such alternative modifications and variations as fall within the spirit and scope of the appended claims. Also, the embodiments set forth therein is not so limitedly, but all or part of the embodiments can be selectively combined so as to derive many variations.

What is claimed is:

1. A substrate treating apparatus comprising:
a drying chamber in which an organic solvent remaining on a substrate is dissolved by using a fluid that is provided as a supercritical fluid to dry the substrate;
a supply unit supplying the fluid into the drying chamber; and
a recycling unit comprising a separator for separating the organic solvent from the fluid discharged from the drying chamber to recycle the fluid, the recycling unit supplying the recycled fluid into the supply unit,
wherein the separator comprises:
a distiller in which a fluid containing an organic solvent having a first concentration is flowed in;
a heating unit heating a fluid containing an organic solvent having a second concentration discharged from the distiller, the heating unit supplying an evaporated fluid containing an organic solvent having a third concentration into the distiller; and
a condensation unit liquefying a fluid containing an organic solvent having a fourth concentration discharged from the distiller,
wherein the organic solvent has the second concentration, the first concentration, the third concentration, and the fourth concentration which are successively lowered in concentration.

2. The substrate treating apparatus of claim 1, wherein the separator further comprises a liquefaction unit disposed between the drying chamber and the distiller to liquefy the fluid discharged from the drying chamber, and
the liquefaction unit supplies the fluid containing the organic solvent having the first concentration into the distiller.

3. The substrate treating apparatus of claim 2, wherein the heating unit comprises:
a heater;
a discharge tube connecting the heater to the distiller to supply the fluid containing the organic solvent having the second concentration from the distiller to the heater;
a recovery tube supplying the fluid containing the organic solvent having the third concentration, which is heated by the heater, into the distiller; and
an organic solvent discharge tube discharging the organic solvent separated from the fluid containing the organic solvent having the second concentration to the outside of the heater.

4. The substrate treating apparatus of claim 3, wherein the distiller further comprises:
a housing;
an inflow tube connecting the liquefaction unit to the housing to supply the fluid containing the organic solvent having the first concentration, which is liquefied by the liquefaction unit, to into the housing,
wherein the recovery tube is connected to the housing at a position that is lower than that of the inflow tube.

5. The substrate treating apparatus of claim 4, wherein a lower packing member is disposed between the recovery tube and the inflow tube in the housing, and
the fluid containing the organic solvent having the first concentration and the fluid containing the organic solvent having the third concentration exchange heat by passing through the lower packing member in opposite directions to each other, respectively.

6. The substrate treating apparatus of claim 3, wherein the condensation unit comprises:
a condenser;
an exhaust tube connecting the distiller to the condenser to supply the fluid containing the organic solvent having the fourth concentration into the condenser; and
a fluid discharge tube discharging the fluid liquefied in the condenser into the outside of the condenser.

7. The substrate treating apparatus of claim 6, wherein the distiller further comprises a supply tube supplying a fluid containing an organic solvent having a fifth concentration into an upper portion of the distiller, and
the fifth concentration is less than the third concentration.

8. The substrate treating apparatus of claim 7, wherein the supply tube is branched from the fluid discharge tube, and
the fifth concentration is the same as the fourth concentration.

9. The substrate treating apparatus of claim 8, wherein the supply tube further comprises a pump supplying the fluid from the condenser to the distiller.

10. The substrate treating apparatus of claim 6, wherein the supply tube is connected to the housing at a position that is higher than that of the inflow tube.

11. The substrate treating apparatus of claim 7, wherein an upper packing member is disposed between the inflow tube and the supply tube in the housing, and
the fluid containing the organic solvent having the third concentration and the fluid containing the organic solvent having the fifth concentration exchange heat by passing through the upper packing member in opposite directions to each other, respectively.

12. The substrate treating apparatus of claim 2, wherein the condensation unit comprises:
a condenser;
an exhaust tube connecting the distiller to the condenser to supply the fluid containing the organic solvent having the fourth concentration into the condenser; and
a fluid discharge tube discharging the fluid liquefied in the condenser into the outside of the condenser.

13. The substrate treating apparatus of claim 12, wherein the distiller comprises:
a housing;
an inflow tube supplying the fluid containing the organic solvent having the first concentration, which is liquefied through the liquefaction unit, into the housing; and
a supply tube supplying the fluid containing the organic solvent having the fifth concentration into the housing,
wherein the supply tube is connected to the housing at a position that is higher than that of the inflow tube.

14. The substrate treating apparatus of claim 13, wherein the supply tube is branched from the fluid discharge tube, and
the fifth concentration is the same as the fourth concentration.

15. The substrate treating apparatus of claim 14, wherein the supply tube further comprises a pump supplying the fluid from the condenser to the distiller.

16. The substrate treating apparatus of claim 13, wherein an upper packing member is disposed between the inflow tube and the supply tube in the housing, and
the fluid containing the organic solvent having the third concentration and the fluid containing the organic solvent having the fifth concentration exchange heat by passing through the upper packing member in opposite directions to each other, respectively.

17. The substrate treating apparatus of claim 4, wherein the inflow tube further comprises:
a valve disposed in the inflow tube;
a first sensor measuring a pressure within the distiller;
a second sensor measuring a pressure within the liquefaction unit; and
a controller receiving signals measured by the first and second sensors to control the valve,
wherein the controller closes the valve when the pressure within the liquefaction unit is greater than or equal to that within the distiller.

18. The substrate treating apparatus of claim 1, wherein the organic solvent comprises isopropyl alcohol (IPA), and
the fluid comprises carbon dioxide ($CO_2$).

19. A recycling unit comprising:
a separator separating an organic solvent from a fluid discharged from a process chamber,
wherein the separator comprises:
a distiller in which a fluid containing an organic solvent having a first concentration is flowed in;
a heating unit heating a fluid containing an organic solvent having a second concentration discharged from the distiller, the heating unit supplying an evaporated fluid containing an organic solvent having a third concentration into the distiller; and
a condensation unit liquefying a fluid containing an organic solvent having a fourth concentration discharged from the distiller,
wherein the organic solvent has the second concentration, the first concentration, the third concentration, and the fourth concentration which are successively lowered in concentration.

20. The recycling unit of claim 19, wherein the separator further comprises a liquefaction unit disposed between the drying chamber and the distiller to liquefy the fluid discharged from the drying chamber, and
the liquefaction unit supplies the fluid containing the organic solvent having the first concentration into the distiller.

21. The recycling unit of claim 20, wherein the heating unit comprises:
a heater;
a discharge tube connecting the heater to the distiller to supply the fluid containing the organic solvent having the second concentration from the distiller to the heater;
a recovery tube supplying the fluid containing the organic solvent having the third concentration, which is heated by the heater, into the distiller; and
an organic solvent discharge tube discharging the organic solvent separated from the fluid containing the organic solvent having the second concentration to the outside of the heater.

22. The recycling unit of claim 21, wherein the distiller further comprises:
a housing;
an inflow tube connecting the liquefaction unit to the housing to supply the fluid containing the organic solvent having the first concentration, which is liquefied by the liquefaction unit, to into the housing,
wherein the recovery tube is connected to the housing at a position that is lower than that of the inflow tube.

23. The recycling unit of claim 22, wherein a lower packing member is disposed between the recovery tube and the inflow tube in the housing, and
the fluid containing the organic solvent having the first concentration and the fluid containing the organic solvent having the third concentration pass through the lower packing member in directions opposite to each other, respectively.

24. The recycling unit of claim 21, wherein the condensation unit comprises:
a condenser;
an exhaust tube connecting the distiller to the condenser to supply the fluid containing the organic solvent having the fourth concentration into the condenser; and
a fluid discharge tube discharging the fluid liquefied in the condenser into the outside of the condenser.

25. The recycling unit of claim 24, wherein the distiller further comprises a supply tube supplying a fluid containing an organic solvent having a fifth concentration into an upper portion of the distiller, and
the fifth concentration is less than the third concentration.

26. The recycling unit of claim 25, wherein the supply tube is branched from the fluid discharge tube, and
the fifth concentration is the same as the fourth concentration.

27. The recycling unit of claim 25, wherein the supply tube is connected to the housing at a position that is higher than that of the inflow tube.

28. The recycling unit of claim 25, wherein an upper packing member is disposed between the inflow tube and the supply tube in the housing, and
the fluid containing the organic solvent having the third concentration and the fluid containing the organic solvent having the fifth concentration exchange heat by passing through the upper packing member in opposite directions to each other, respectively.

29. The recycling unit of claim 20, wherein the condensation unit comprises:
a condenser;

an exhaust tube connecting the distiller to the condenser to supply the fluid containing the organic solvent having the fourth concentration into the condenser; and a fluid discharge tube discharging the fluid liquefied in the condenser into the outside of the condenser.

30. The recycling unit of claim 29, wherein the distiller comprises:

a housing;

an inflow tube supplying the fluid containing the organic solvent having the first concentration, which is liquefied through the liquefaction unit, into the housing; and a supply tube supplying the fluid containing the organic solvent having the fifth concentration into the housing, wherein the supply tube is connected to the housing at a position that is higher than that of the inflow tube.

31. The recycling unit of claim 30, wherein the supply tube is branched from the fluid discharge tube, and the fifth concentration is the same as the fourth concentration.

32. The recycling unit of claim 30, wherein an upper packing member is disposed between the inflow tube and the supply tube in the housing, and the fluid containing the organic solvent having the third concentration and the fluid containing the organic solvent having the fifth concentration exchange heat by passing through the upper packing member in opposite directions to each other, respectively.

33. The recycling unit of claim 19, wherein the organic solvent comprises isopropyl alcohol (IPA), and the fluid comprises carbon dioxide ($CO_2$).

* * * * *